United States Patent
Fuesser et al.

[11] Patent Number: 5,861,058
[45] Date of Patent: Jan. 19, 1999

[54] COMPOSITE STRUCTURE AND METHOD FOR THE PRODUCTION THEREOF

[75] Inventors: Hans-Juergen Fuesser, Gerstetten-Dettingen; Reinhard Zachai, Guenzburg; Wolfram Muench, Mannheim; Tim Gutheit; Mona Ferguson, both of Ulm; Reiner Schaub, Darmstadt; Karl-Heinrich Greeb, Dreieich, all of Germany

[73] Assignee: Daimler-Benz Aktiengesellschaft, Stuttgart, Germany

[21] Appl. No.: 635,513

[22] Filed: Apr. 22, 1996

[30] Foreign Application Priority Data

Apr. 20, 1995 [DE] Germany ............... 195 14 542.9

[51] Int. Cl.$^6$ ............................................. C30B 29/02
[52] U.S. Cl. .................. 117/90; 117/94; 117/95; 117/97; 117/913; 117/929; 423/446
[58] Field of Search ............... 117/913, 929, 117/90, 94, 95, 97; 423/446

[56] References Cited

U.S. PATENT DOCUMENTS

| 4,222,814 | 9/1980 | Reitz ........................ 117/10 |
| 4,806,996 | 2/1989 | Luryi ....................... 117/913 |
| 5,156,881 | 10/1992 | Okano et al. . |
| 5,363,793 | 11/1994 | Sato ........................... 117/2 |
| 5,385,796 | 1/1995 | Okano et al. . |
| 5,397,428 | 3/1995 | Stoner et al. ............ 117/929 |
| 5,458,919 | 10/1995 | Okano et al. . |
| 5,525,537 | 6/1996 | Zachai et al. ........... 117/929 |
| 5,591,486 | 1/1997 | Okano et al. . |

FOREIGN PATENT DOCUMENTS

| EP 153520 | 6/1996 | European Pat. Off. . |
| 63-228626 | 9/1988 | Japan . |

*Primary Examiner*—Robert Kunemund
*Attorney, Agent, or Firm*—Evenson, McKeown, Edwards & Lenahan, P.L.L.C.

[57] ABSTRACT

A composite structure for electronic components, having a base substrate with a flat side provided with a depression, and having a cover layer which is disposed on the flat side structured by the depression, and the depression being covered to form a hollow structure. The depression in the base substrate is created prior to the deposition of the cover layer and has a clear width measured parallel to the flat side that is less than one-half of its clear depth measured before the cover layer is applied. The vapor phase deposited cover layer is formed from a material which has a sufficiently high surface tension to promote three-dimensional growth of the vapor phase deposited layer.

33 Claims, 5 Drawing Sheets

COMPOSITE STRUCTURE AND METHOD FOR THE PRODUCTION THEREOF

BACKGROUND OF THE INVENTION

This invention relates to a composite structure for electronic components comprising a base substrate formed with a depression on one flat side and a cover layer disposed on the flat side structured by the depression to cover the depression and form a hollow structure. The invention further relates to a method for producing a composite structure of the foregoing type in which a flat side of a base substrate is provided with a depression, and the flat side of the base substrate structured by the depression is then covered with a cover layer to form a hollow structure.

In microelectronics, electronic components are known which have various functions and applications, such as integrated circuits, vacuum diodes or flat-panel displays for flat video screens. They have hollow structures, some of them open and some of them fully enclosed. The hollow structures are generally made by first creating depressions in one flat side of a base substrate, especially by selective etching, and then covering them with a layer which is applied to the flat side of the base substrate which has thus been structured by the etching, and then enclosed at least in the direction of the structured flat side, in a manner forming the hollow structures.

In the aforementioned hollow electronic component structures, the application of the layer covering the depressions is very expensive and also problematic, because in applications in the microelectronic field, even the slightest impurities can result in the rejection of the component and therefore must be avoided.

Furthermore, some components of this kind, especially flat panel displays, are difficult and expensive to produce, since the structuring operations required to manufacture them are difficult to carry out, and since it is also necessary that the structuring of the flat side of the base substrate, and hence the topography of the components, be extremely precise.

SUMMARY OF THE INVENTION

It is an object of the present invention to provide an improved composite structure of the aforementioned general type.

It is also an object of the invention to provide a composite structure which can be readily manufactured relatively inexpensively while maintaining clean conditions suitable for the manufacture of high quality microelectronic components.

These and other objects are achieved in accordance with the present invention by providing a composite structure for an electronic component, the composite structure comprising a base substrate having a depression formed in a flat side thereof, and a vapor-deposited cover layer composed of a material having a surface tension sufficiently high to promote three-dimensional layer growth, the cover layer being vapor deposited on the flat side of the base substrate in which the depression is formed to cover the depression and form a hollow structure, and the depression having a maximum free width measured parallel to the flat side which is less than half its depth measured prior to deposition of the cover layer.

In accordance with a further aspect of the invention, the objects are also achieved by providing a method of making a composite structure for an electronic component, comprising the steps of providing a base substrate having a flat side with a depression formed therein, the depression having a depth equal to at least half of its maximum clear width measured parallel to the flat side, and vapor phase depositing a cover layer on the flat side of the substrate over the depression to form a hollow structure, the cover layer having a thickness equal to at least 0.5 times the maximum clear width of the depression and being composed of a material having a sufficiently high surface tension to promote three-dimensional growth when vapor phase deposited.

The cover layer according to the invention is applied by deposition from the gas phase, i.e. by vapor phase deposition. This process takes place under clean-room conditions and in today's technology it is to be considered as simple and effective to prevent impurities and contamination. This is made possible by the knowledge that, when materials which are to be deposited from the gas phase have a surface tension sufficiently high that they preferentially grow in a three-dimensional manner, then the recesses or depressions are covered over or bridged and thereby form hollow structures so long as the recesses or depressions in question have the prescribed dimensions. The depressions or recesses must be sufficiently deep that the width of the depression will be bridged by the three-dimensional growth of the cover layer before the depression is filled in by vapor phase deposited material. In general, the conditions for such three-dimensional growth (so called "Island Growth" or Volmer-Weber Conditions) are known in the art; see e.g. Vook, R. W., *Int. Met. Rev.*, 27(4):109–211 (1982). The precise conditions in any given case may vary somewhat depending on the material constants of the vapor deposited cover layer material, which can be determined for a given material by consulting standard reference works such as *Landolt-Boernstein*.

BRIEF DESCRIPTION OF THE DRAWINGS

The invention will be described hereinafter in further detail with reference to illustrative preferred embodiments shown in the accompanying drawings in which.

DETAILED DESCRIPTION OF PREFERRED EMBODIMENTS

Figure 1:
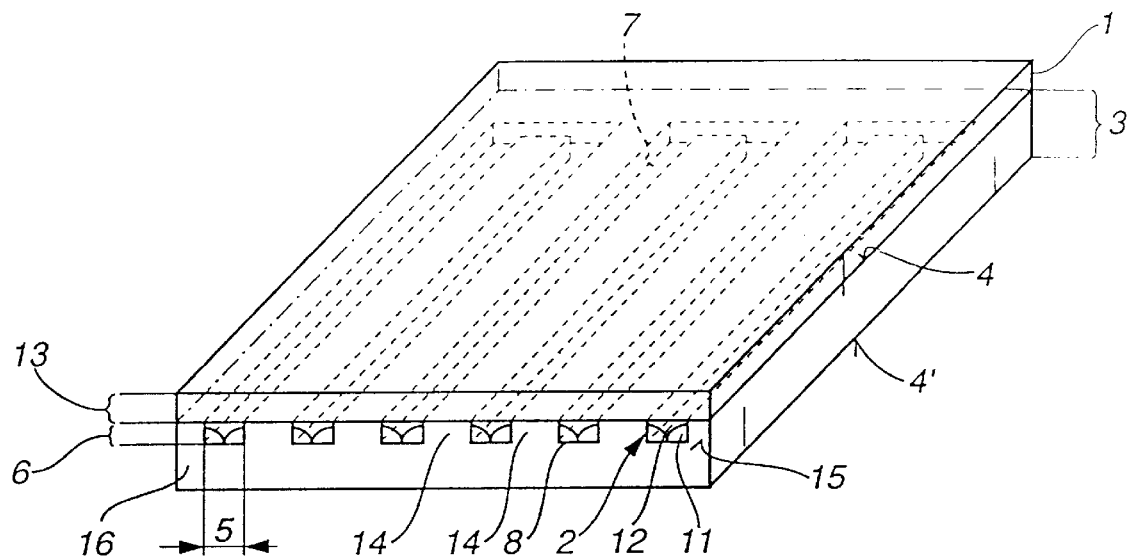
FIG. 1 shows a perspective view of a composite structure with ridges disposed between the depressions.

FIG. 1 is a perspective view of a basic configuration of a composite structure. The composite structure of FIG. 1 comprises a base substrate 3 with a structured flat side 4 provided with a plurality of depressions 2, which have a generally U-shape as viewed from the end face 15 of the base substrate. The structured flat side 4 of base substrate 3 is covered by a cover layer 1. Between the depressions 2 are ridges or ribs 14 which separate the depressions 2 from one another. Furthermore, the depressions 2 open through the narrow end face 15 of the base substrate 3, so that the depressions 2 form with the cover layer 1 a channel structure, through which, for example, a fluid can flow. Consequently, such composite structures can be used, for example, as microcooling devices.

The depressions 2 have in cross section a clear depth 6 which is somewhat greater than half of the clear width 5 thereof. Where the walls 7 of the depressions 2 extend parallel and approximately rectilinearly, the clear width 5 is taken to be the minimum clear distance between opposite walls 7 in the area of the structured flat side 4. The minimum ratio of depth 6 to width 5 of a depression 2 is 0.5, keeping in mind that as the ratio of depth 6 to width 5 increases, the resulting hollow structures 12 have a larger open cross section through which, if desired, a fluid can flow. Advantageously, the ratio of depth to width will be greater than 1, preferably greater than 2.

Disposed on the structured flat side 4 is a cover layer 1 which sealingly closes the depressions 2 in the structured side 4. The cover layer 1 may advantageously be made of diamond, particularly polycrystalline diamond, in which the individual crystallites have lattice planes with orientations which are statistically distributed.

A cover layer 1 of diamond is advantageous since this material has the property that it grows preferentially in a three-dimensional manner when deposited from a gas phase, as in a CVD (chemical vapor deposition) process. Furthermore, pure and undoped diamond is a good electrical insulator and at the same time a good conductor of heat, which also is stable at high temperatures.

The following is a description of a method for producing a composite structure in accordance with FIG. 1. To make the base substrate, preferably a silicon wafer is cleaned as a growth substrate 16 in a conventional manner. The cleaned growth substrate 16 is prepared for a selective etching by known techniques to create the depressions 2. For example, the cleaned growth substrate 16 can be prepared by coating the growth surface that later will be the structured flat side 4 of the growth substrate 3 with a photoresist, exposing the photoresist to a pattern of light corresponding to the depressions 2 which are subsequently to be formed, and subjecting the growth substrate 16 with the exposed photoresist to a selective wet-chemical etching in which the desired structure of the depressions is etched away to the desired depth 6 and width 5. After the depressions 2 have been made, the preparation of the base substrate 3 for the embodiment of FIG. 1 is finished.

Then, by means of a CVD process, especially a plasma CVD process, a cover layer 1 of preferably polycrystalline diamond is deposited on the flat side 4 of the base substrate which has been structured with the depressions 2. It is desirable, at least during the initial formation of growth nuclei for the cover layer 1, to apply to the base substrate 3 a negative electrical potential with respect to the gas phase being deposited. Preferably, the cover layer 1 is deposited epitaxially.

The deposition and epitaxial growth of the diamond cover layer 1 is carried out using known precursor gases, such as gaseous hydrocarbons etc., and known process conditions, such as those described in published German Patent Application No. DE 42 33 085. The cover layer 1 is deposited in a thickness 13 which corresponds at least to 0.5 times the clear width 5 of a depression 2.

Figure 2:
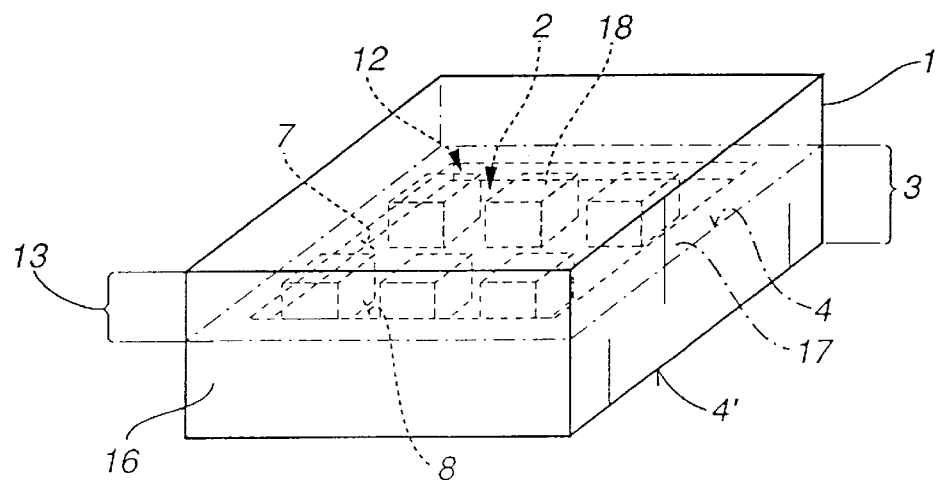
FIG. 2 shows a perspective view of a composite structure with islands disposed between the depressions.

FIG. 2 illustrates another basic composite structure. In contrast to the composite structure of FIG. 1, this composite structure has a hollow structure 12 which is closed on all sides. To form this hollow structure 12, the base substrate has a frame 17 completely surrounding the margin of the base substrate, within which the surface of the base substrate is recessed or depressed like a basin. On the depressed area inside the frame 17, block-like islands or projections 18 are disposed which extend toward and abut the cover layer 1. The depressions which form the hollow structure 12 are situated between the islands 18. In this embodiment, the distance 5 between the islands 18 and/or the distance between the islands 18 and the frame 17, which distance corresponds to the free width 5 of the depressions 2, is less than half the height of the islands 18 above the bottom 8 of the recesses which form the depressions 2, which height corresponds to the depth 6 of the depressions 2.

In order to fabricate the base substrate 3, the recesses or depressions 2 are produced by wet chemical etching as described above. Then a preferably diamond cover layer 1 with a polycrystalline orientation is sealingly applied to the flat side 4 of the base substrate 3 which has been provided with the depressions 2. Diamond cover layer 1 is applied, as described above, from a gas phase by means of a known CVD process.

Since the sealing covering of the depressions 2 takes place in the reactor of a CVD apparatus, the gas-filled spaces of the resulting hollow structure 12 will exhibit the gas composition and pressure which prevailed in the reactor when the cover layer 1 was deposited. Because of this, it is relatively simple to influence, and thus manipulate, the conditions in the gas space of the hollow structure 12.

Figure 3:
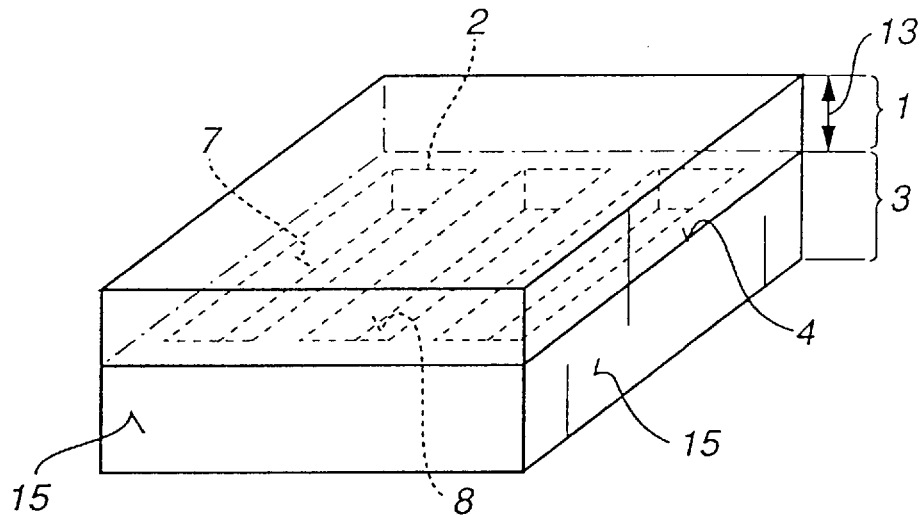
FIG. 3 shows a perspective view of a composite structure having quadrilateral depressions.

FIG. 3 shows a composite structure with elongated, quadrilateral depressions 2. The quadrilateral depressions 2 each form a hollow structure which is closed off on all sides and which in the vicinity of the structured flat side 4 is sealingly closed by the cover layer 1, which preferably is formed of polycrystalline diamond. This composite structure of FIG. 3 can be produced in the manner described above, and therefore, to avoid unnecessary repetition, its production will not be discussed in more detail.

Figure 4:
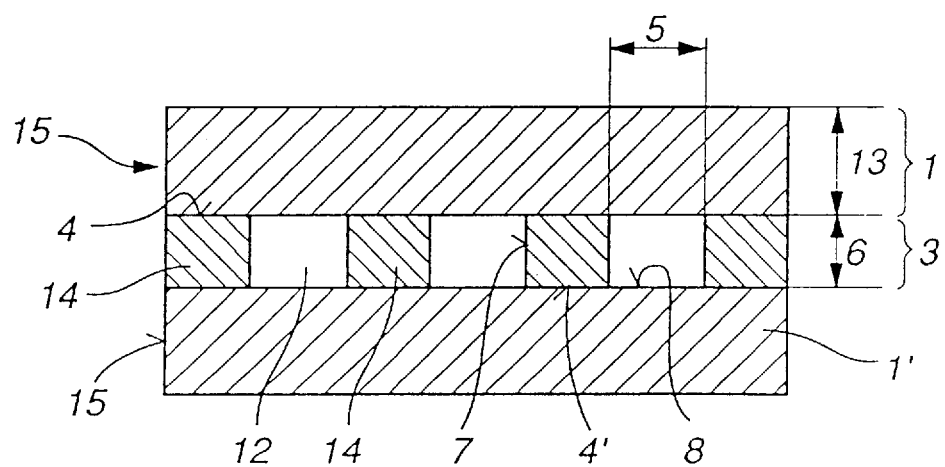
FIG. 4 shows a sectional view through a composite structure with ridges between the depressions and two cover layers.

FIG. 4 is a sectional view through a composite structure which has a hollow structure 12, and in which each of the external flat sides 4 and 4' is formed by a cover layer 1 and 1', respectively, of preferably polycrystalline is diamond. The base substrate 3, which in the previous embodiments was formed of a solid block of material, for example monocrystalline silicon, is formed in this embodiment only by ribs or ridges 14 which are spaced apart from one another, and which separate the individual depressions 2 of the base substrate 3 from one another. This means that in this embodiment the ridges 14 serve on the one hand to spatially separate the individual depressions 2 and on the other hand to maintain the spacing between the two cover layers 1 and 1'.

A composite structure formed with two cover layers 1 and 1', and with an open hollow structure 12 through which a fluid can flow, is especially suitable for use as a microcooling device, particularly since electronic components can be arranged on both flat sides of the composite structure.

In order to manufacture a composite structure according to FIG. 4, a first cover layer 1' is applied to one flat side 4' of the base substrate 3 consisting especially of monocrystalline silicon. If desired, cover layer 1' can be applied by means of chemical vapor deposition. On the other hand it may also be advantageous to apply cover layer 1', in the form of a separate preformed sheet or plate to the base substrate, in particular by soldering it to the base substrate.

During the vapor deposition or application of cover layer 1', the base substrate 3 may, if desired, already be provided with preliminary recesses or depressions 2 which have not yet reached their final depth 6. In such a case, cover layer 1' is preferably applied to the flat side 4' which lies opposite the structured flat side 4 of base substrate 3.

After the initial cover layer 1' has been deposited or applied, the depressions 2 are formed or extended in the base substrate 3 in such a way that the material of the base substrate 3 is completely removed in the area of the depressions 2. Thus, the bottom 8 of a depression 2 is formed by the initial cover layer 1'. When the material of the base substrate 3 has been fully removed in the area of the depressions 2, the other cover layer 1 is deposited by the CVD process onto the structured flat side 4, i.e. the flat side that is not covered by cover layer 1'. The deposition or growth of the cover layer 1 results in the formation of the hollow structure 12 of the ensuing composite structure according to FIG. 4.

Figure 5:
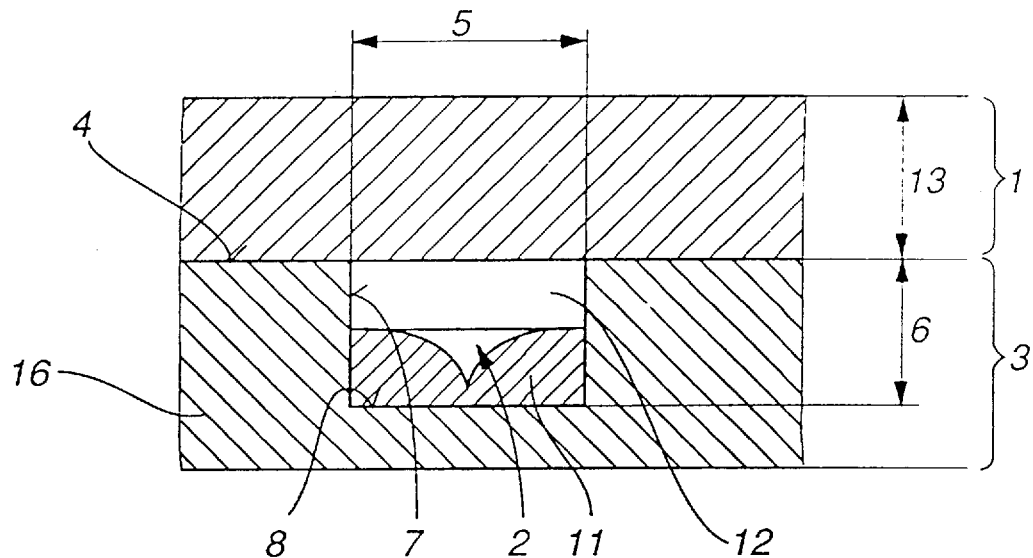
FIG. 5 shows a sectional view through a depression with an electron-emitting layer arranged at the bottom of the depression.

FIG. 5 shows a sectional view through a depression 2 which has a bottom layer 11 formed on the base 8 of the depression 2. A bottom layer 11 of this kind, which generally has a layer thickness corresponding approximately to one-half the width of the depression 2, is to be expected whenever a cover layer 1 of diamond is deposited by a CVD process, since the diamond grows not only in the area of the structured flat side 4, but also in the area of the bottom of the depression 2. Since as the degree of closure of the depression increases, the depositing gas phase within the depression 2 becomes depleted, it ultimately becomes impossible for further deposition of the bottom layer 11 to occur. Consequently, so long as a depression 2 has the aforementioned dimensions, it cannot fill up entirely.

Figure 6:
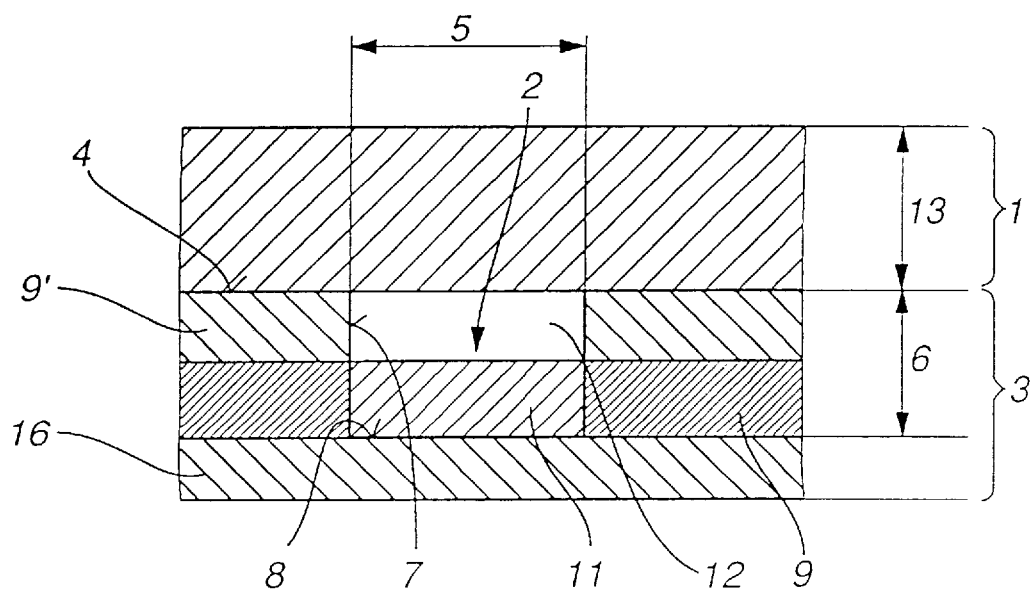
FIG. 6 shows a sectional view through a depression with a diamond coating disposed near the bottom and with an intermediate layer supplying charge carriers to the diamond layer on the bottom of the depression.

FIG. 6 is a sectional view through another depression 2 in which the base substrate 3 of the composite structure has a multi-layer construction aligned parallel to the flat side of the composite structure. The lowermost layer is formed by a growth substrate 16 on which is disposed a first intermediate layer in the form of a donor layer 9 extending parallel to the structured flat side 4 on both sides of a depression 2 provided with a bottom layer 11. The materials of the highly doped donor layer 9, especially n-doped C-BN (cubic boron nitrite), and of the bottom layer 11, especially undoped, vapor-deposited diamond, are matched or coordinated with each other such that their band edge curve in the vicinity of the boundary surface between the donor layer 9 and the bottom layer 11 forms a band discontinuity such that charge carriers from the donor layer 9 flow into the bottom layer 11 without application of any external influence.

In the direction of the subsequently applied cover layer 1, an additional, second intermediate layer 9' is disposed on the donor layer 9. Additional intermediate layer 9' extends parallel to the structured flat side 4 and is formed especially as an electrical insulating layer, preferably of silicon oxide or undoped C-BN. Above the bottom layer 11 there is a free space which represents what remains of the former depression 12. In this embodiment, the aforementioned layers, with the exception of the bottom layer 11, constitute the base substrate 3 of the composite structure according to FIG. 6.

The cover layer 1 is arranged on the second intermediate layer 9, which preferably is constructed as an insulating layer. The cover layer 1 simultaneously also closes up the hollow structure 12 forming the depression 2, while the aforementioned free space above the bottom layer 11 remains free.

In order to prepare the base substrate 3, the donor layer is applied to the entire surface of the growth substrate 16, and then the insulating layer 9' is applied on top of the donor layer 9. Donor layer 9 is preferably applied in a thickness corresponding approximately to the order of magnitude of the thickness of the subsequently deposited bottom layer 11.

A photoresist is applied to the free flat side 4 of the base substrate 3 (i.e., to the free, flat side of the insulating layer 9') and exposed in a pattern corresponding to the desired structure of the depressions 2. Then the depressions 2 are selectively etched to the desired depth 6 by conventional wet chemistry etching techniques.

Then, as in the case of a depression 2 according to FIG. 5, the cover layer 1 is deposited from a gas phase onto the structured flat side 4 of the base substrate 3 formed by a free flat side 4 of the insulating layer 9', thereby initially depositing the bottom layer 11 in depression 2 and ultimately closing up the depression to form the hollow structure 12.

The individual layers of this base substrate 3, can be applied using known epitaxial processes or combinations thereof with other known deposition methods. The subsequently deposited cover layer 1 requires only a single epitaxial deposition from the gas phase.

Figure 7:
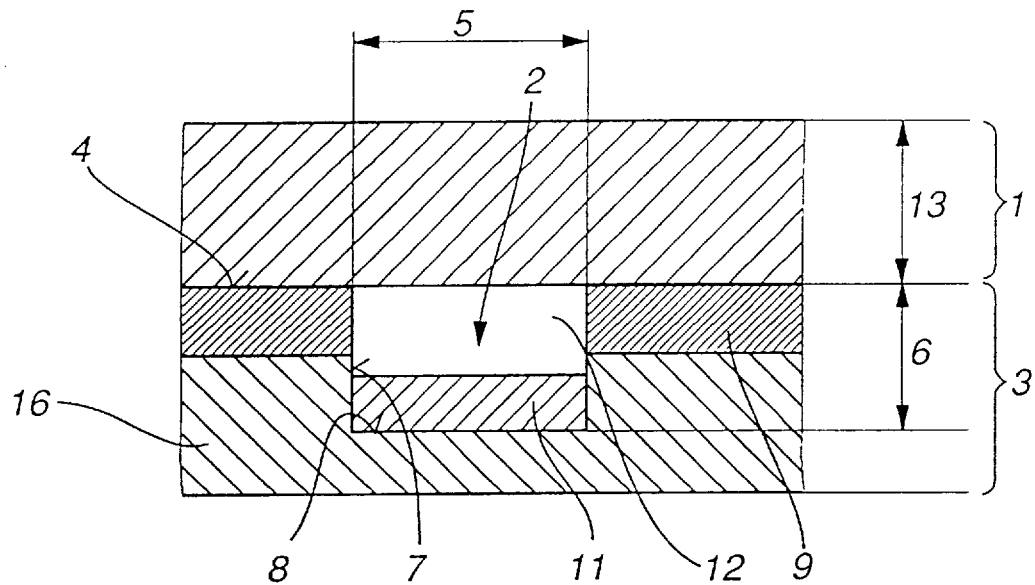
FIG. 7 shows a sectional view through a depression with an intermediate layer extending parallel to the flat side of the base substrate and arranged beneath the cover layer.

FIG. 7 is a sectional view through a depression 2 of a composite structure having a base substrate 3 with an intermediate layer 9 extending parallel to its structured flat side 4. On the bottom of depression 2 there is a bottom layer 11 which terminates in the growth substrate 16 at the wall 7 of the depression 2 below the level of intermediate layer 9. Therefore, there is a distance different from zero between the free surface of the bottom layer 11, which forms the boundary of the hollow structure 12, and the lowermost edge or boundary of the intermediate layer 9.

Above the depression 2, and thus on top of the intermediate layer 9, a cover layer 1 of diamond is deposited epitaxially from a gas phase, thereby sealing off the depression 2 in the vicinity of the structured flat side 4 to form the hollow structure 12. In some cases it may be advantageous, prior to the application of the cover layer 1, to electrically insulate the base substrate 3 from the cover layer 1 by means of an insulating layer (not shown).

To produce the base substrate 3 for a composite structure according to FIG. 7, the initial intermediate layer 9 is deposited on a growth substrate 16. After the first intermediate layer 9 has been deposited, the depression 2 is formed by selective etching to obtain a prepared base substrate 3 with a structured flat side 4. Then the cover layer 1 of diamond is applied onto the structured flat side 4 by means of a CVD process in a reactor.

It is also fundamentally possible to prepare the base substrate 3 by initially partially forming the depression 2 in the growth substrate 16, then depositing the first intermediate layer 9 on the surface of growth substrate 16 in which the depression 2 is partially formed, and thereafter selectively etching in the remainder of the depression 2.

Figure 8:
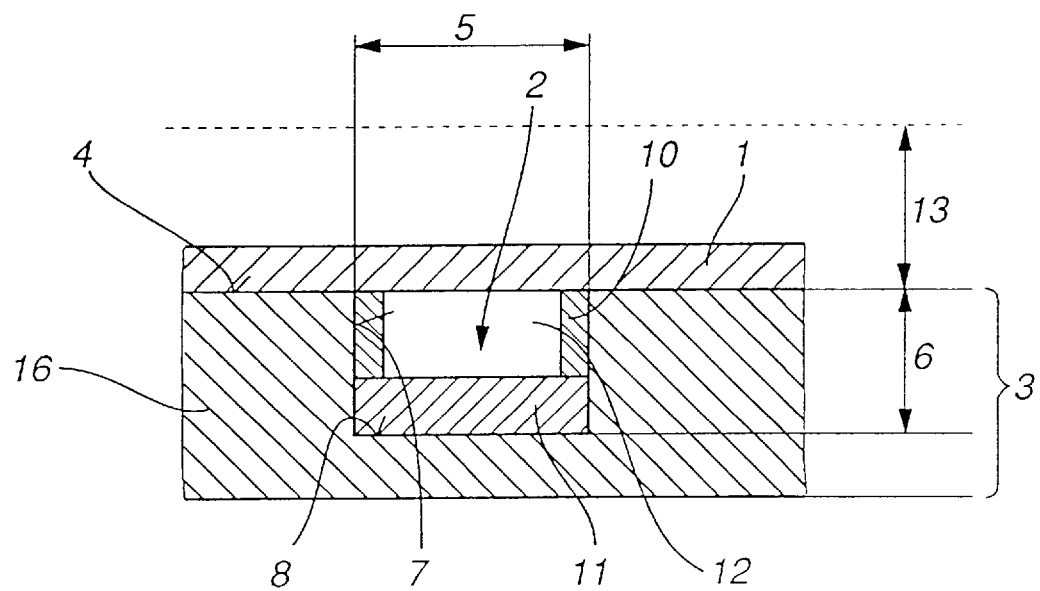
FIG. 8 shows a sectional view through a depression with a layer disposed on the bottom of the depression and with an intermediate layer which is disposed adjacent a wall and which covers the wall.

FIG. 8 shows an enlargement of a section taken through a composite structure in the vicinity of a depression 2. This composite structure embodiment comprises an intermediate layer 10 which extends parallel to the walls 7 of depression 2 and at least partially covers the walls 7. Depending on the desired electronic component, intermediate layer 10 may be made of magnetic material, insulating material, metallic material and/or other material. Examples of suitable materials include silicon oxide ($SiO_2$), cobalt disilicide ($CoSi_2$), undoped diamond, etc.

At the base 8 of the depression 2 there is a bottom layer 11 which adjacent the walls 7 adjoins the intermediate layer 10 on the sides of the walls. Depending on the desired electronic component, it Is also possible to provide space between the intermediate layer 10 on the side of the wall and the bottom layer 11 and/or to electrically insulate them from one another.

In the case of a composite structure envisioned for use as a detector, for example, it is desirable to make the diamond cover layer 1, which is arranged above the depression 2 and which forms a window of the depression 2, as thin as possible. For this reason, the cover layer 1, which was initially deposited up to the dashed line shown in FIG. 8, is removed or ablated, at least above the depression 2.

To produce a base substrate 3 for the composite structure of FIG. 8, a depression 2 is created in the known manner in a growth substrate 16. A place-holder layer is introduced into the depression 2 adjacent the base 8 of the depression. This place-holder layer has a layer thickness that corresponds approximately to the distance between the subsequently deposited intermediate layer 10 along the wall 7 and the base surface 8 of depression 2. If, as in the case of the composite structure according to FIG. 8, the intermediate layer 10 and the bottom layer 11 are to have a connection at the wall, the thickness of the place-holder layer will correspond to the thickness of the bottom layer 11 that later will take its place. Suitable materials for the place-holder layer include silicon nitride ($Si_3N_4$), silicon oxide ($SiO_2$), and other materials known for use in selective etching of integrated circuits.

The material of the intermediate layer 10 extending along the wall is deposited on top of the place-holder layer. The material then is removed again, in particular by selective wet-chemical etching, up to the areas adjacent the walls of the depressions in which it forms the intermediate layer 10 of the composite structure according to FIG. 8. The material of the place-holder layer is also removed with the central portion of the material of intermediate layer 10.

The structured flat side 4 of the resulting base substrate 3 is then coated with the cover layer 1, and the bottom layer 11 in the depression 2 is simultaneously deposited with the cover layer 1. It may likewise be useful to provide an electrically insulating layer (not shown) between the cover layer 1 and the base substrate 3.

So that the window formed by the cover layer 1 over the depression 2 will be as thin as possible, the deposited cover layer 1 is removed, at least in the area of the depression, for example by etching, until its thickness is reduced to the desired dimension.

Figure 9:
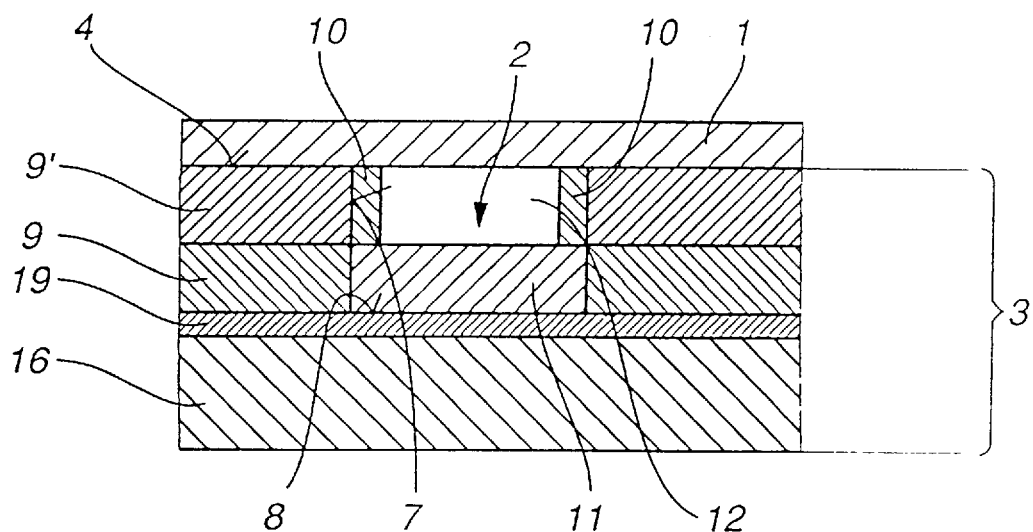
FIG. 9 shows a sectional view through a depression comprising an intermediate layer and a plurality of additional layers extending parallel to the flat side of the base substrate.

FIG. 9 shows a sectional view through a depression 2 in a composite structure with a multi-layer base substrate 3. The lowermost layer (i.e., the layer opposite from the cover layer) constitutes a growth substrate 16, made especially from monocrystalline silicon, on which an adapter layer 19, preferably a silicon-carbon alloy, is disposed to eliminate any lattice mismatch.

The adapter layer 19 has a lattice constant that varies with increasing thickness, the value adjacent the growth substrate 16 corresponding approximately to the lattice constant of the growth substrate 16, and the value adjacent its flat side remote from the growth substrate 16 corresponding approximately to the lattice constant of the adjoining layer. In the case of an as adapter layer 19 of silicon-carbon alloy and a growth substrate 16 of silicon, this is achieved by decreasing the proportion of silicon in the adaptor layer 19 beginning from 100% adjacent the growth substrate 16 to 0% at its flat side remote from the growth substrate.

In the base substrate 3 a depression 2 is disposed which has a bottom layer 11 at the base 8 thereof, and an intermediate layer 10 adjacent the walls 7 of the depression 2 covering at least some areas of the walls.

On the adapter layer 19 there is a bottom layer 11 in the area of the depression 2, and on both sides of the bottom layer 11 there is an initial intermediate layer 9, in the form of a donor layer, which extends parallel to the flat side 4 of the base substrate 3. The material of the highly doped donor layer 9, in particular n-doped C-BN (cubic boron nitride), and that of the bottom layer 11, in particular undoped, vapor-deposited diamond, are matched to one another such that their band edge curve at the boundary surface between the donor layer 9 and the bottom layer 11 forms a band discontinuity such that charge carriers from the donor layer 9 flow into the bottom layer 11 without application of any external influence.

Another intermediate layer 9' is disposed on the donor layer in the direction of the subsequently to be applied cover layer 1, and is formed especially as an electrical insulating layer, preferably of silicon dioxide or undoped C-BN.

Adjacent the walls 7 of the depression 2, the additional intermediate layer 9', which preferably is formed as an insulating layer, has an intermediate layer 10 which extends parallel to wall 7, and which can be made, for example, of a permanently magnetic and/or electrically conductive material, especially a metal.

Above the bottom layer 11 and between the intermediate layer 10 adjacent the walls 7 there is a free space which represents the remainder of the former depression 2. In the present embodiment, the enumerated layers, with the exception of the base layer 11, form the base substrate 3 of the composite structure of FIG. 9.

To prepare the base substrate 3 of FIG. 9, an adapter layer 19, especially a Si—C alloy, is applied to a growth substrate 16, which is formed preferably of monocrystalline silicon. The adapter layer 19 has a lattice structure which is similar to that of the initial intermediate layer 9, especially of n-doped cubic boron nitride (C-BN), which subsequently covers the adapter layer 19 and which is used as a donor layer.

The lattice constants of the adapter layer 19, which is applied by means of a CVD process, are varied over its layer thickness by adjusting the composition of the gas phase from which it is deposited, so that in the vicinity of the growth substrate 16, they substantially correspond to those of the growth substrate, and in the vicinity of the initial intermediate layer 9, i.e. the donor layer, they substantially correspond to those of the intermediate layer.

The donor layer 9 is applied to the adapter layer 19 by means of gas phase epitaxy, and the additional intermediate layer 9', especially of undoped cubic boron nitride, which is used as an insulating layer, is deposited on the initial intermediate layer 9.

After the additional intermediate layer 9' is applied, the depression 2 is produced in the known manner, and the intermediate layer 10 is disposed adjacent the walls 7 in the vicinity of the additional intermediate layer 9', thereby completing the base substrate 3 of the composite structure according to FIG. 9.

Then, by means of a CVD process, the structured flat side 4 of the base substrate 3 is covered with the covering layer 1, thus forming the hollow structure and the bottom layer 11 is grown epitaxially. Again in this embodiment, the thickness of the cover layer 1 is finally reduced by ablating the surface of the material of the cover layer 1.

Figure 10:
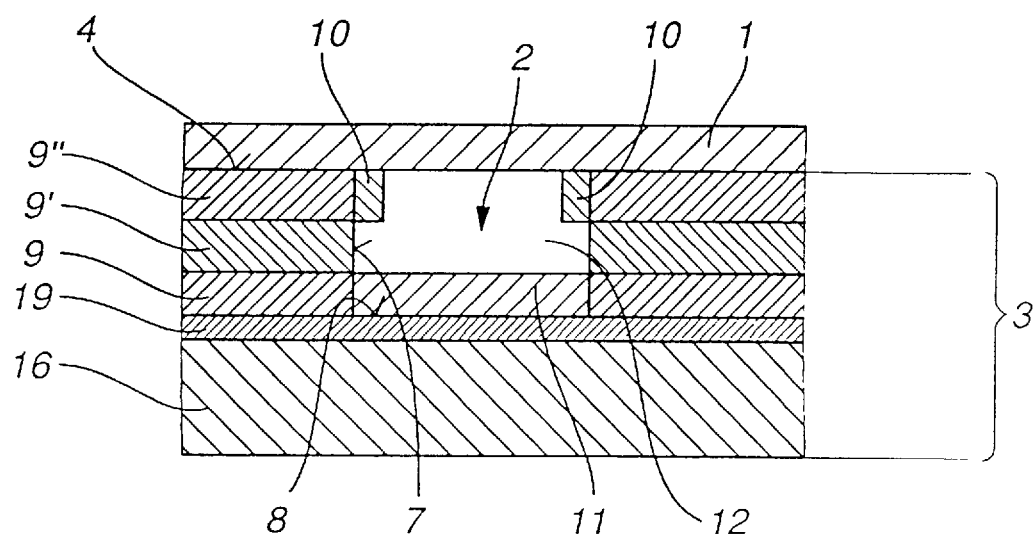
FIG. 10 shows a sectional view through a depression having an intermediate layer disposed beneath the cover layer and extending parallel to the flat side; a donor layer near the bottom and extending parallel to the flat side, and a layer covering the floor of the depression.

FIG. 10 shows a composite structure which is very similar to that of FIG. 9. The composite structure of FIG. 10 differs from the composite structure of FIG. 9 mainly in that it has an additional, third intermediate layer 9" which is situated underneath the cover layer 1. The third intermediate layer 9" is in this embodiment preferably is formed of metal and extends parallel to the structured flat side 4 of the composite structure. Adjacent the wall 7 of the depression 2 the third intermediate layer 9" is covered by the intermediate layer 10 which extends parallel to the wall 7. The third intermediate layer 9" has a layer thickness which corresponds approximately to the dimension exhibited in the same direction by the intermediate layer 10 which extends parallel to the wall and preferably is made of a magnetic material. Thus, in the embodiment shown in FIG. 10, the intermediate layer 10 adjacent the wall also is spaced away from the bottom layer 11.

The procedure for preparing the base substrate 3 for a composite structure according to FIG. 10, and the composite structure itself, can be readily derived from the methods described above. To avoid unnecessary repetition, therefore, it will not be described in further detail.

In general it may be said that the invention includes all embodiments as well as other layered structures having covered hollow structures. Furthermore, it is useful in some cases to arrange an electrically insulating layer between the cover layer of the composite structure and the base substrate. The same applies to other functional layers having one of the composite structures either shown in the drawings or not shown.

The foregoing description and examples have been set forth merely to illustrate the invention and are not intended to be limiting. Since modifications of the described embodiments incorporating the spirit and substance of the invention may occur to persons skilled in the art, the invention should be construed broadly to include all variations falling within the scope of the appended claims and equivalents thereof.

What is claimed is:

1. A composite structure for an electronic component, said composite structure comprising:
   a base substrate having a depression formed in a flat side thereof, and
   a vapor-deposited cover layer composed of diamond and having a surface tension sufficiently high to promote three-dimensional layer growth, said cover layer being vapor deposited on the flat side of the base substrate in which the depression is formed to cover the depression and form a hollow structure, and said depression having a maximum free width measured parallel to said flat side which is less than half its depth measured prior to deposition of the cover layer.

2. A composite structure according to claim 1, wherein said cover layer is formed of polycrystalline diamond having crystallite lattice planes with statistically distributed orientations.

3. A composite structure for an electronic component, comprising:
   a base substrate having a depression formed in a flat side-thereof, and
   a vapor-deposited cover layer composed of a material having a surface tension sufficiently high to promote three-dimensional layer growth, said cover layer being vapor deposited on the flat side of the base substrate in which the depression is formed to cover the depression and form a hollow structure, and said depression having a maximum free width measured parallel to said flat side which is less than half its depth measured prior to deposition of the cover layer,
   wherein said depression has a wall portion at least partly covered by an intermediate layer of a material different from the cover layer and from the base substrate.

4. A composite structure according to claim 3, wherein said cover layer further comprises a dopant material, and the material of the intermediate layer also is different from the dopant.

5. A composite structure according to claim 1, wherein said depression has a wall portion between its bottom and the cover layer provided at least partially with an intermediate layer extending parallel to the flat side of the substrate, said intermediate layer being formed of a material different from the cover layer and the base substrate.

6. A composite structure according to claim 1, wherein said intermediate layer is doped differently from said cover layer or said base substrate.

7. A composite structure for an electronic component, comprising:
   a base substrate having a depression formed in a flat side thereof, and
   a vapor-deposited cover layer composed of a material having a surface tension sufficiently high to Promote three-dimensional layer growth, said cover layer being vapor deposited on the flat side of the base substrate in which the depression is formed to cover the depression and form a hollow structure, and said depression having a maximum free width measured parallel to said flat side which is less than half its depth measured prior to deposition of the cover layer,
   wherein said base substrate adjacent a wall of said depression between the bottom of the depression and the cover layer is provided with an intermediate layer of an electrically conductive material.

8. A composite structure according to claim 7, wherein said electrically conductive material is a metal.

9. A composite structure according to claim 1, wherein said base substrate adjacent a wall of said depression between the bottom of the depression and the cover layer is provided with an intermediate layer which forms an electronic gate.

10. A composite structure for an electronic component, comprising:
    a base substrate having a depression formed in a flat side thereof, and
    a vapor-deposited cover layer composed of a material having a surface tension sufficiently high to promote three-dimensional layer growth, said cover layer being vapor deposited on the flat side of the base substrate in which the depression is formed to cover the depression and form a hollow structure, and said depression having a maximum free width measured parallel to said flat side which is less than half its depth measured prior to deposition of the cover layer, wherein said base substrate is a doped, substantially crystalline material, and wherein said depression has a wall which adjacent the bottom of the depression is formed of the same material as the base substrate, and which adjacent said cover layer is provided with an intermediate layer.

11. A composite structure according to claim 10, wherein said base substrate consists of doped silicon.

12. A composite structure according to claim 1, wherein the base substrate is made of monocrystalline silicon, and the depression has a wall which adjacent its bottom also is made of silicon, and which adjacent the cover layer is provided with an intermediate layer of metal.

13. A composite structure for an electronic component, comprising:
  a base substrate having a depression formed in a flat side thereof, and
  a vapor-deposited cover layer composed of a material having a surface tension sufficiently high to promote three-dimensional layer growth, said cover layer being vapor deposited on the flat side of the base substrate in which the depression is formed to cover the depression and form a hollow structure, and said depression having a maximum free width measured parallel to said flat side which is less than half its depth measured prior to deposition of the cover layer,
  wherein the depression at its bottom has an electron emitting layer spaced away from the cover layer by the hollow structure, and wherein the cover layer has an electron visualizing property.

14. A composite structure according to claim 13, wherein said electron visualizing property is selected from the group consisting of luminescence and phosphorescence.

15. A composite structure according to claim 1, wherein the cover layer is applied to the base substrate by epitaxial deposition from a gas phase.

16. A method of making a composite structure for an electronic component, said method comprising the steps of:
  providing a base substrate having a flat side with a depression formed therein, said depression having a depth equal to at least one half its maximum clear width measured parallel to said flat side, and
  vapor phase depositing a cover layer on said flat side of the substrate over said depression to form a hollow structure, said cover layer having a thickness equal to at least 0.5 times the maximum clear width of the depression and being composed of diamond and having a sufficiently high surface tension to promote three-dimensional growth when vapor phase deposited.

17. A method according to claim 16, wherein said cover layer is a vapor phase deposited polycrystalline diamond layer.

18. A method of making a composite structure for an electronic component, comprising the steps of:
  providing a base substrate having a flat side with a depression formed therein, said depression having a depth equal to at least one half its maximum clear width measured parallel to said flat side,
  vapor phase depositing a cover layer on said flat side of the substrate over said depression to form a hollow structure, said cover layer having a thickness equal to at least 0.5 times the maximum clear width of the depression and being composed of a material having a sufficiently high surface tension to promote three-dimensional growth when vapor phase deposited; and
  initially applying a self-supporting layer to a flat side of said substrate opposite the flat side in which said depression is formed, prior to vapor phase depositing said cover layer over said depression, whereby a base substrate covered on opposite flat sides is obtained.

19. A method according to claim 18, wherein said self-supporting layer is soldered to said base substrate.

20. A method according to claim 16, wherein a first cover layer is vapor phase deposited on said flat side of the base substrate, and a second cover layer is vapor phase deposited on an opposite flat side of the base substrate.

21. A method according to claim 16, further comprising initially applying a cover layer to a flat side of said base substrate opposite the flat side provided with said depression, and thereafter forming or extending said depression through said base substrate to expose a contiguous face of said initially applied cover layer, prior to said vapor phase deposition of a cover layer over said depression to form the hollow structure.

22. A method according to claim 16, wherein said cover layer is deposited by chemical vapor phase deposition.

23. A method of making a composite structure for an electronic component, comprising the steps of:
  providing a base substrate having a flat side with a depression formed therein, said depression having a depth equal to at least one half its maximum clear width measured parallel to said flat side,
  vapor phase depositing a cover layer on said flat side of the substrate over said depression to form a hollow structure, said cover layer having a thickness equal to at least 0.5 times the maximum clear width of the depression and being composed of a material having a sufficiently high surface tension to promote three-dimensional growth when vapor phase deposited;
  wherein said cover layer is deposited by chemical vapor deposition, and wherein an electrical potential is applied at least temporarily to said base substrate during said chemical vapor phase deposition.

24. A method according to claim 23, wherein said electrical potential applied to said base substrate is a negative electrical potential relative to the vapor phase.

25. A method according to claim 16, wherein said depression has a wall between its bottom and the cover layer, said method further comprising applying an intermediate layer on top of said wall, said intermediate layer being composed of a material different from said cover layer and said base substrate.

26. A method according to claim 16, wherein said depression has a wall between its bottom and the cover layer, said method further comprising applying an intermediate layer on top of said wall, said intermediate layer being doped differently from said cover layer or said base substrate.

27. A method according to claim 16, wherein said depression has a wall between its bottom and the cover layer, said method further comprising applying an intermediate layer on top of said wall, said intermediate layer extending parallel to the flat side of the base substrate, and said intermediate layer being composed of a material different from said cover layer and said base substrate.

28. A method according to claim 16, wherein said depression has a wall between its bottom and the cover layer, said method further comprising applying an intermediate layer on top of said wall, said intermediate layer extending parallel to the flat side of the base substrate, and said intermediate layer being doped differently from said cover layer or said base substrate.

29. A method according to claim 16, wherein said depression has a wall between its bottom and the cover layer, said method further comprising applying an intermediate layer over said wall, said intermediate layer extending parallel to said wall, and said intermediate layer being composed of a material different from said cover layer and said base substrate.

30. A method according to claim 16, wherein said depression has a wall between its bottom and the cover layer, said method further comprising applying an intermediate layer over said wall, said intermediate layer extending parallel to said wall, and said intermediate layer being doped differently from said cover layer or said base substrate.

31. A method of making a composite structure for an electronic component, comprising the steps of:

provniding a base substrate having a flat side with a depression formed therein, said depression having a depth equal to at least one half its maximum clear width measured parallel to said flat side, vapor phase depositing a cover layer on said flat side of the substrate over said depression to form a hollow structure, said cover layer having a thickness equal to at least 0.5 times the maximum clear width of the depression and being composed of a material having a sufficiently high surface tension to promote three-dimensional growth when vapor phase deposited, wherein said depression has a wall between its bottom and the cover layer, and applying an electrically conductive intermediate layer on top of said wall.

32. A method according to claim 31, wherein said electrically conductive layer is a metal layer.

33. A method according to claim 16, further comprising after the vapor phase deposition of the cover layer to form the hollow structure, the step of treating the cover layer to decrease its thickness.

* * * * *